(12) United States Patent
Kim

(10) Patent No.: US 7,838,412 B2
(45) Date of Patent: Nov. 23, 2010

(54) METHOD FOR MANUFACTURING A SEMICONDUCTOR DEVICE

(75) Inventor: Hyung Kyu Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 314 days.

(21) Appl. No.: 12/129,769

(22) Filed: May 30, 2008

(65) Prior Publication Data

US 2009/0111258 A1    Apr. 30, 2009

(30) Foreign Application Priority Data

Oct. 31, 2007    (KR) .................... 10-2007-0110685

(51) Int. Cl.
    *H01L 21/44* (2006.01)
(52) U.S. Cl. .............. 438/612; 438/424; 438/427; 438/605; 438/666; 438/700; 438/702; 438/703
(58) Field of Classification Search ............ 438/424, 438/427, 612, 605, 666, 700, 702, 703
    See application file for complete search history.

(56) References Cited

U.S. PATENT DOCUMENTS

2002/0146898 A1 * 10/2002 Aoki ..................... 438/617

2003/0080428 A1 * 5/2003 Izumitani et al. ............ 257/758

FOREIGN PATENT DOCUMENTS

| JP | 06-349886 | 12/1994 |
| JP | 2002-064100 | 2/2002 |
| JP | 2006-245468 | 9/2006 |

* cited by examiner

*Primary Examiner*—N Drew Richards
*Assistant Examiner*—Jae Lee
(74) *Attorney, Agent, or Firm*—Marshall, Gerstein & Borun LLP

(57) ABSTRACT

A manufacturing method of a semiconductor device wherein a metal pad is etched to form a trench in which a central part is concave in form, or to form a trench in the shape of a cylinder or a parallelepiped on the edge part of a metal pad. Accordingly, the contact area between a polymide isoindro quirazorindione (PIQ) or similar curable layer and the metal pad is increased and the bondability is improved. Accordingly, the technology of improving the characteristic of device by preventing the problem that the metal pad is excessively opened in a subsequent curing process and the layer of a lower portion of the metal pad is attacked is disclosed.

7 Claims, 15 Drawing Sheets

(i)

(ii)

METHOD FOR MANUFACTURING A SEMICONDUCTOR DEVICE

CROSS-REFERENCE TO RELATED APPLICATION

The priority of Korean patent application number 10-2007-0110685, filed on Oct. 31, 2007, the disclosure of which is incorporated by reference in its entirety, is claimed.

BACKGROUND OF THE INVENTION

The present invention relates to a semiconductor device and, more particularly, to a metal pad open process for manufacturing a semiconductor device.

In general, a pad is a part which is connected with a wire in a wire bonding process of the assembly process which forms a semiconductor chip, while a semiconductor device communicates signals between the inside and the outside through the pad.

In addition, in the manufacturing process of the semiconductor device, when a plurality of chips are prepared on wafers, a passivation layer is formed as a final protection layer in order to protect the chips from an undesirable environment. After the formation of the passivation layer, the pad is opened by removing the passivation layer on the pad in order to connect a lead line which is to be connected with an outside circuit in the package process with the pad of chip.

FIGS. 1a to 1g are cross-sectional views showing the manufacturing method of a semiconductor device according to the related art.

Referring to FIG. 1a, an intervening dielectric layer 105 and a metal pad 120 are formed over a semiconductor substrate 100. Here, a titanium layer 110 is formed under the metal pad 120, while a titanium nitride film 125 is formed on the metal pad 120.

Referring to FIG. 1b, a passivation layer 130 is formed on an entire surface including the metal pad 120.

Referring to FIG. 1c, a first photoresist pattern (not shown) is formed over the passivation layer 130.

Here, it is preferable that the first photoresist pattern (not shown) is formed while the center of the metal pad 120 is opened.

Then, the passivation layer 130 is etched, using the first photoresist pattern (not shown) as a mask to expose the titanium nitride film 125, which is formed on the metal pad 120. Then, the first photoresist pattern (not shown) is removed.

Referring to FIGS. 1d and 1e, a curable polymide isoindro quirazorindione (PIQ) layer 135 is formed on an entire surface including the etched passivation layer 130.

A second photoresist pattern 140 is formed over the PIQ layer 135.

At this time, it is preferable that the second photoresist pattern 140 is formed while the edge part of the etched passivation layer 130 is not opened.

Then, the PIQ layer 135 is etched, using the second photoresist pattern 140 as a mask.

At this time, it is preferable that the PIQ layer 135 remains in the side wall of the etched passivation layer 130.

Then, the second photoresist pattern 140 is removed.

Referring to FIG. 1f, a curing process is performed for the PIQ layer 135.

The PIQ layer 135 is condensed by the curing process. Due to this, the PIQ layer 135, which was formed on the side wall of the etched passivation layer 130, retrogrades into the upper portion of the passivation layer 130. Therefore, the region opened by the PIQ layer 135 is widened.

At this time, the PIQ layer 135 is unable to cover the area over the outer ring of the metal pad 120 in the curing process, and a lifting phenomenon (see 'A') is generated.

Referring to FIG. 1g, the etching process is performed to remove the titanium nitride film 125 on the metal pad 120, so that the metal pad 120 is exposed.

FIGS. 2a to 2d are cross-sectional views showing another method of manufacturing a semiconductor device according to the related art.

Referring to FIGS. 2a and 2b, an intervening dielectric layer 205, a metal pad 220 and a passivation layer 230 are formed over a semiconductor substrate 200 with a method as illustrated in FIGS. 1a and 1b. A titanium layer 210 is formed under the metal pad 220, while a titanium nitride film 225 is formed on the metal pad 220

The passivation layer 230 is etched so that the passivation layer 230 of a constant thickness remains over the metal pad 220 such that the metal pad 220 is not exposed.

A PIQ layer 235 is formed on the entire surface including the etched passivation layer 230.

Referring to FIG. 2b, the PIQ layer 235 is etched in order that the PIQ layer 235 remains on aside wall of the etched passivation layer 230.

Referring to FIG. 2c, when the curing process is performed for the PIQ layer 235, the PIQ layer 235 is condensed so that the opened region is widened.

Here, while the PIQ layer 235 is condensed, the PIQ layer 235 formed on the side wall of the etched passivation layer 230 retrogrades into the direction in which the opened region is widened, so that it remains only over the passivation layer 230.

At this time, the lifting phenomenon A if the PIQ layer 235 is generated.

Referring to FIG. 2d, the etching process for removing the titanium nitride film 225 such that the passivation layer 230 remains over the metal pad 220 is performed.

At this time, a gap between the metal pad 220 excessively opened in the etching process generates an attack (see 'B') in the passivation layer 230.

In the manufacturing method of a semiconductor device according to the related art, there is a problem in that the metal pad is excessively opened due to the PIQ layer. Hence, the attack occurs in the subsequent PIQ layer etching process and the layer of the lower portion of the metal pad is damaged. Accordingly, the reliability of device is lowered.

BRIEF SUMMARY OF THE INVENTION

According to a first embodiment of the invention, a method for manufacturing a semiconductor device comprises: forming a metal pad over a semiconductor substrate; etching the metal pad to form a trench defining at least one side surface; forming a first protection layer on an entire surface including the metal pad; etching the first protection layer whereby the first protection layer remains on the trench; forming a curable second protection layer on an entire surface including the etched first protection layer and the trench; etching the second protection layer whereby the first protection layer on the metal pad is exposed and the second protection layer remains on a side surface of the trench; curing the second protection layer; and etching the exposed first protection layer to expose the metal pad.

According to a second embodiment of the invention, a method for manufacturing a semiconductor device comprises: forming a metal pad over a semiconductor substrate, said metal pad comprising edge portions and an interior area bounded by the edge portions; forming a trench on a location which is spaced from the edge portions of the metal pad into the interior surface by etching the metal pad, said trench defining a side wall; forming a first protection layer on an entire surface including the trench; etching the first protection layer whereby the first protection layer remains over the metal pad; etching the first protection layer whereby the first protection layer remains on a side wall of the trench; forming a curable second protection layer on an entire surface including the etched first protection layer; etching the second protection layer whereby the second protection layer remains over the trench; curing the second protection layer; and etching the first and second protection layers to expose the side wall of the trench and the metal.

DESCRIPTION OF EMBODIMENTS

FIGS. 3a to 3g are cross-sectional views and perspective views showing the manufacturing method of a semiconductor device according to a first embodiment of the invention.

Figure 1A:
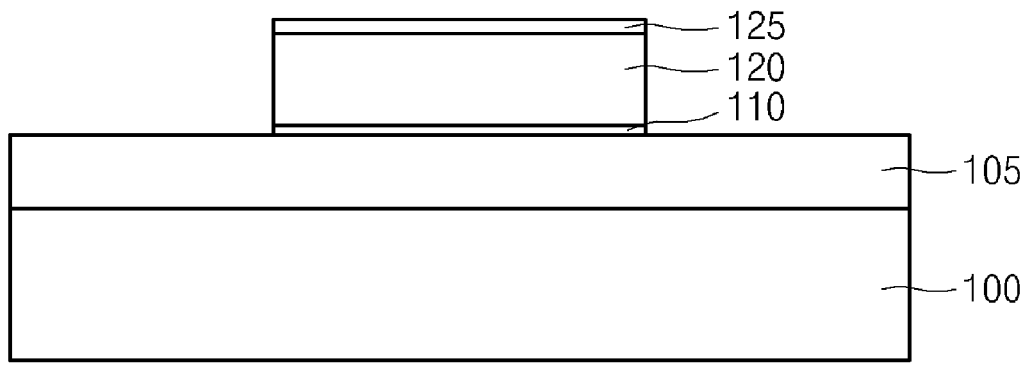
FIGS. 1a to 1g are cross-sectional views showing a manufacturing method of a semiconductor device according to the prior art.
Figure 1B:
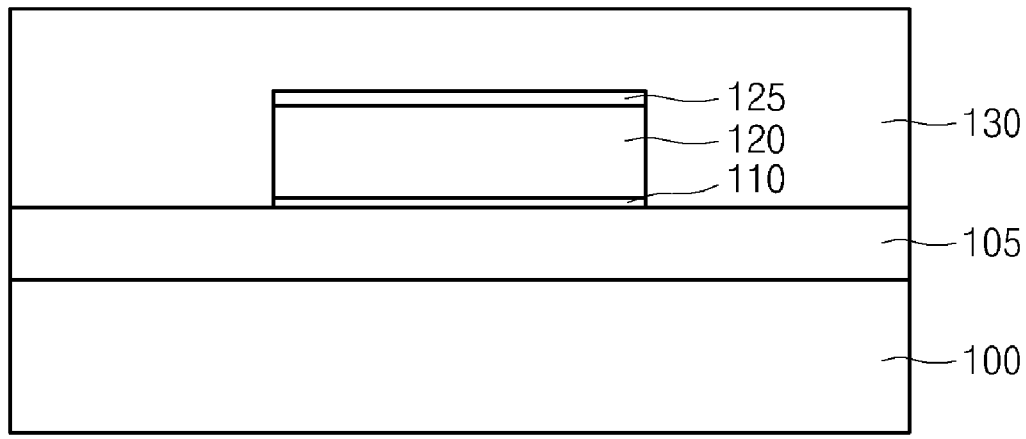
Figure 1C:
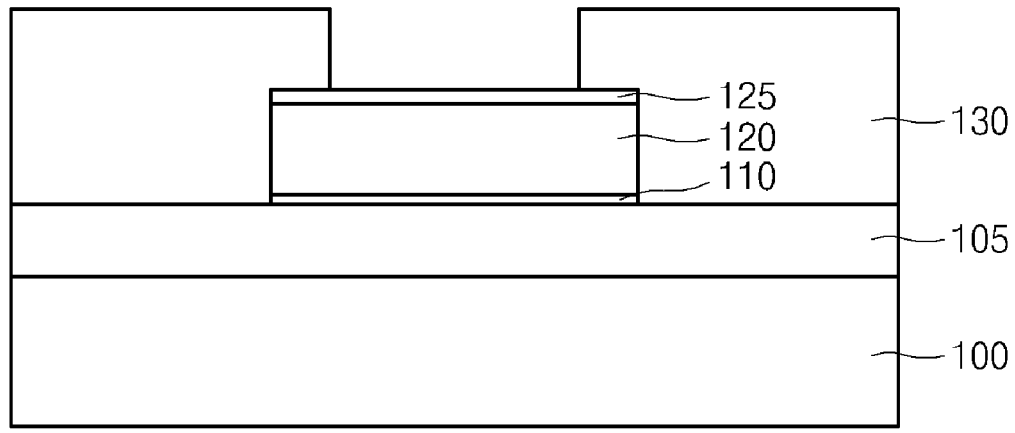
Figure 1D:
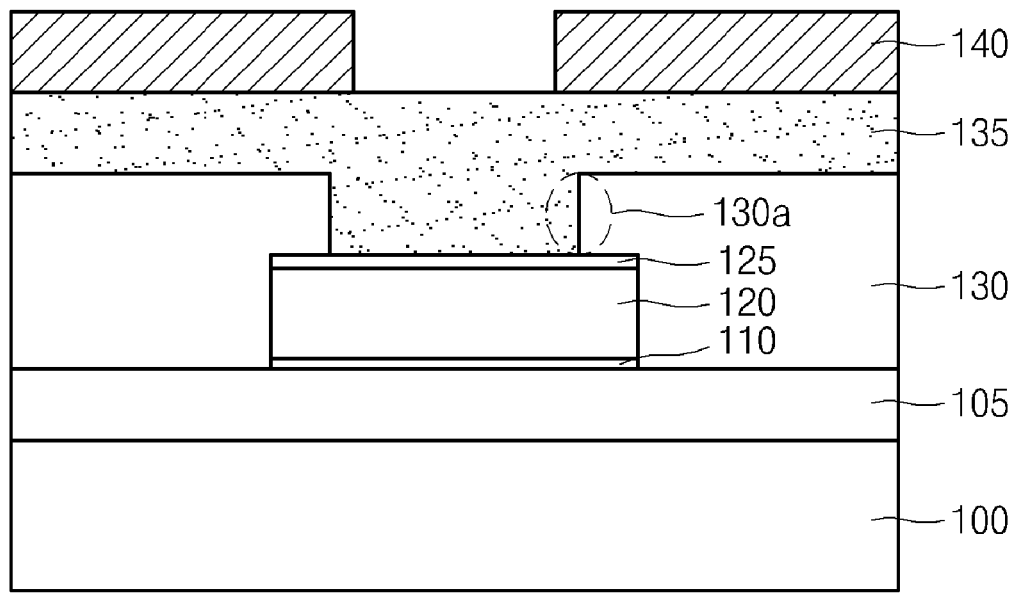
Figure 1E:
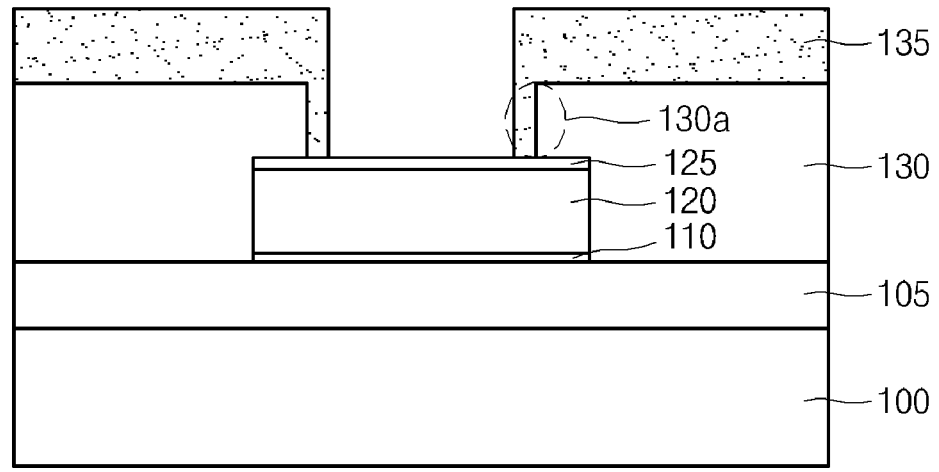
Figure 1F:
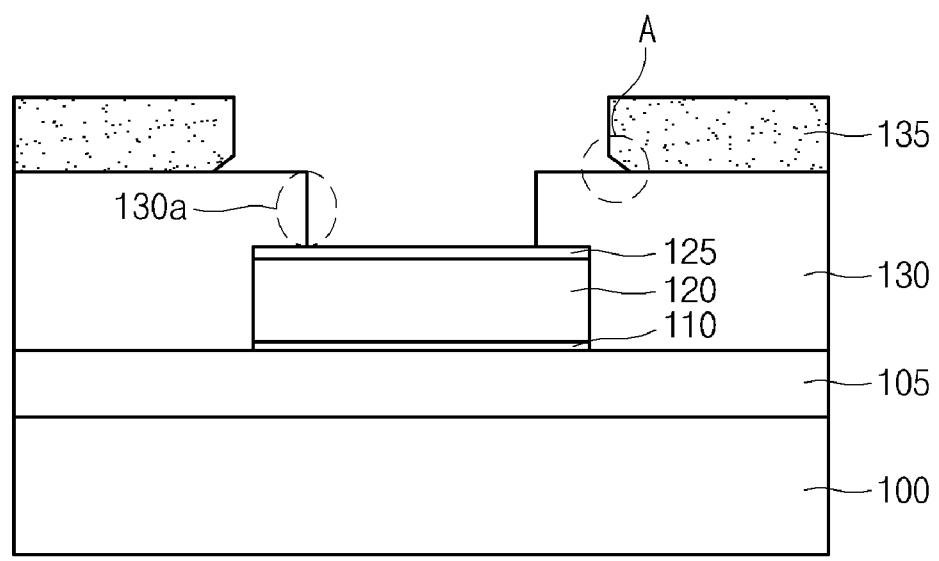
Figure 1G:
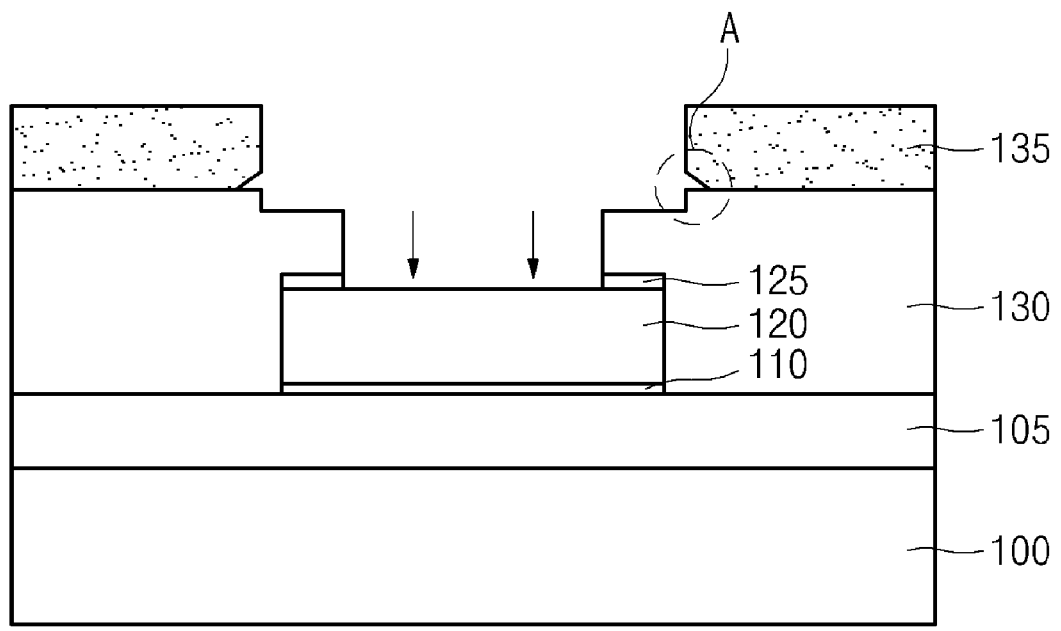
Figure 2A:
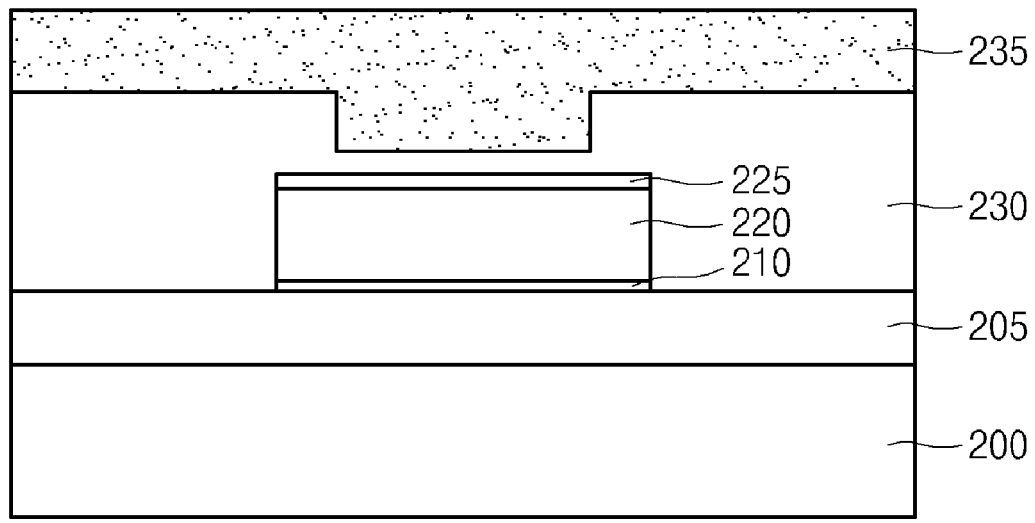
FIGS. 2a to 2d are cross-sectional views showing a manufacturing method of a semiconductor device according to the prior art.
Figure 2B:
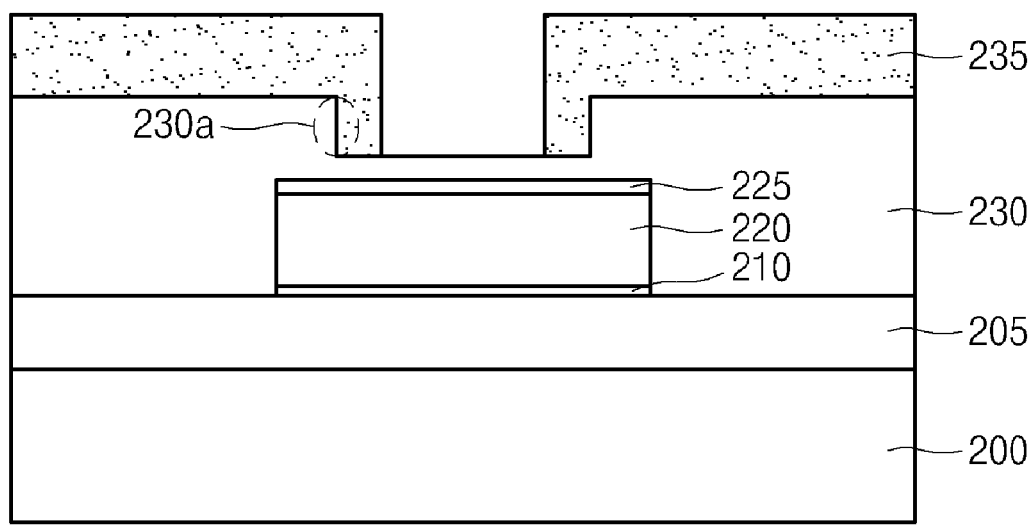
Figure 2C:
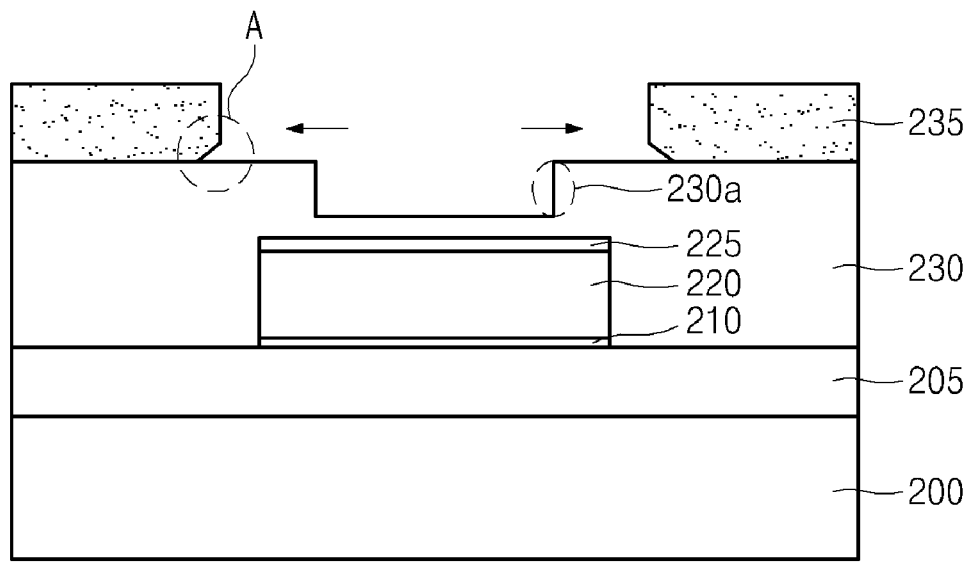
Figure 2D:
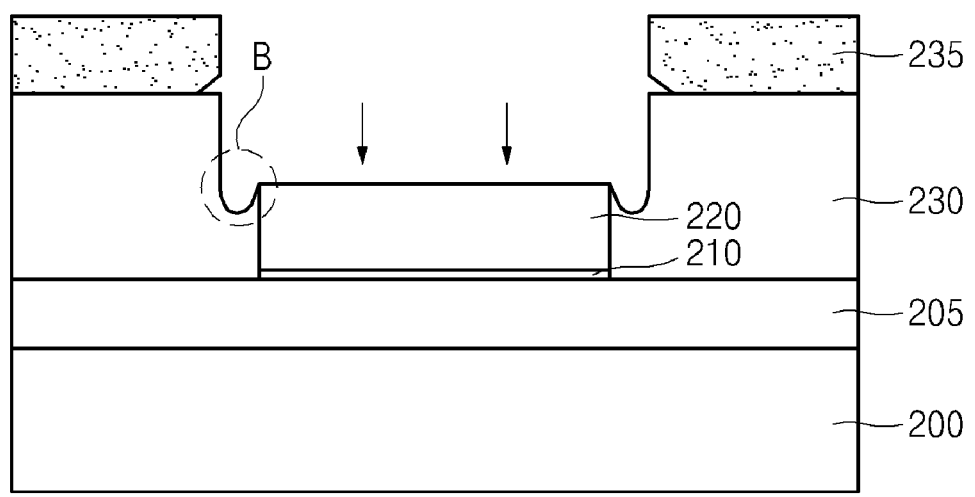
Figure 3A:
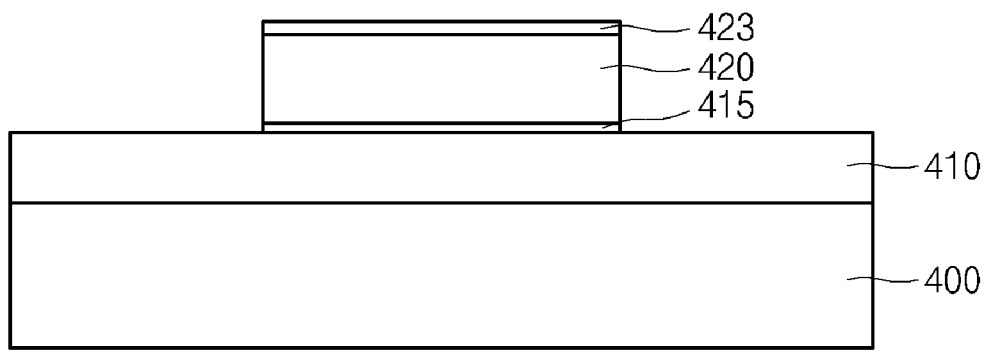
FIGS. 3a to 3g are cross-sectional views showing the manufacturing method of a semiconductor device according to a first embodiment of the invention.

Referring to FIG. 3a, an intervening dielectric layer 410 and a metal pad 420 are formed over a semiconductor substrate 400.

Here, a titanium nitride film 423 and a titanium film 415 are formed on and under the metal pad 420, respectively.

Figure 3B:
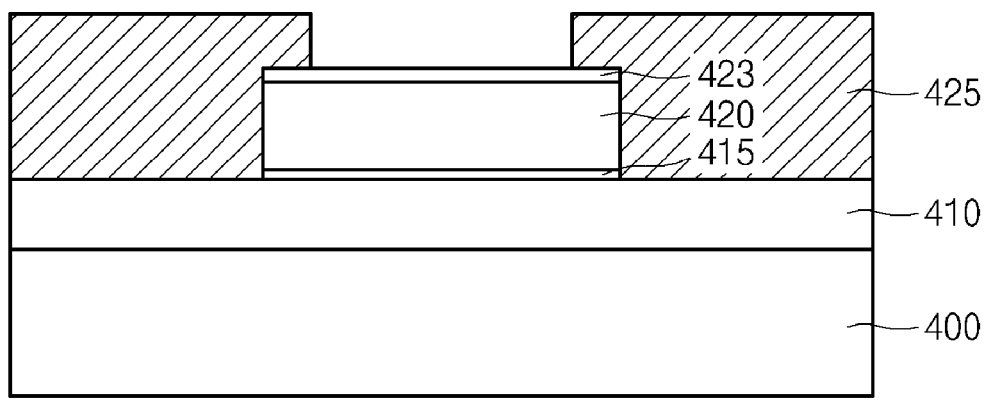

Referring to FIG. 3b, a first photoresist pattern 425 is formed, opening a central portion of the metal pad 420.

At this time, preferably, in the first photoresist pattern 425, the central part is opened within the range that the edge part of the metal pad 420 is not exposed.

Figure 3C:
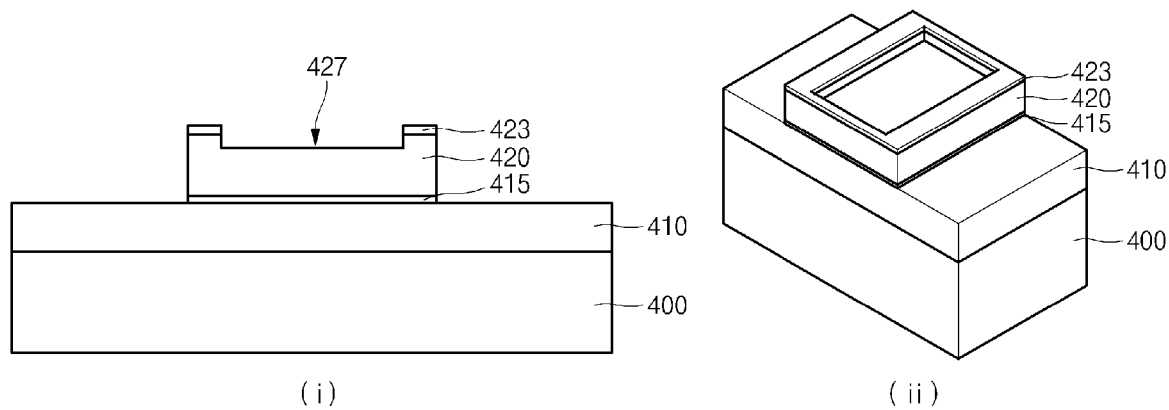

Referring to FIG. 3c(i), the titanium nitride film 423 and the metal pad 420 are etched with the first photoresist pattern 425 as a mask to form a trench so that the central part of the metal pad 420 is concave, i.e., defines a trench.

Then, the first photoresist pattern 425 is removed.

A passivation layer 430 is then formed on an entire substrate including the trench formed in the metal pad 420.

Here, FIG. 3c(ii) is a perspective view showing the formed metal pad 420, showing that a concave trench is formed in the central part of the metal pad 420.

At this time, a step difference is generated in the edge part of the metal pad 420 with the trench.

Figure 3D:
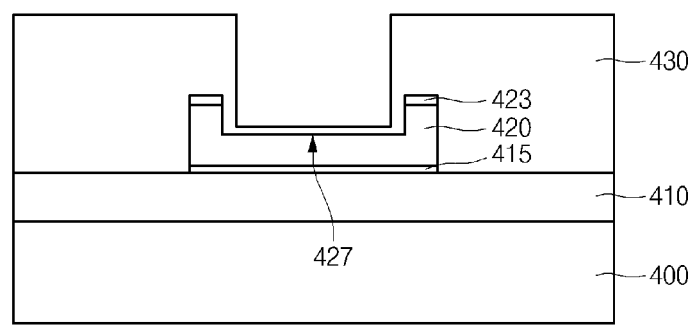

Referring to FIG. 3d, a second photoresist pattern (not shown) for a repair process is formed over the passivation layer 430. It is preferred that the step difference which is generated in the either side of the trench is not opened in the second photoresist pattern (not shown).

The passivation layer 430 is then etched using the second photoresist pattern (not shown) as a mask.

At this time, preferably, the passivation layer 430 remains on the surface and sidewalls of the trench.

Then, the second photoresist pattern (not shown) is removed.

Figure 3E:
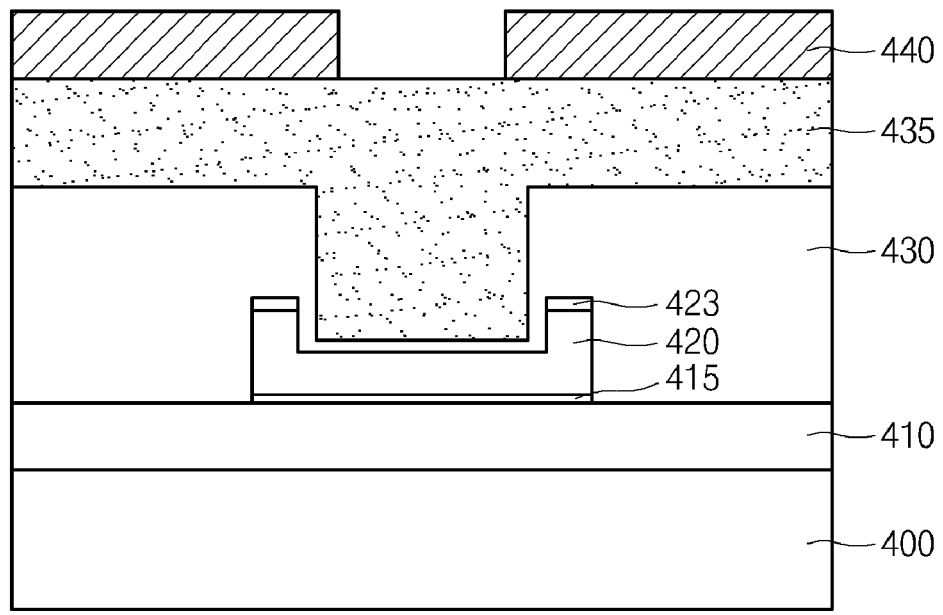

Referring to FIG. 3e, a curable polyimide isoindro quirazorindione (PIQ) (or other suitable curable material) layer 435 is formed on an entire surface including the etched passivation layer 430.

A third photoresist pattern 440 is formed over the PIQ layer 435.

At this time, preferably, the third photoresist pattern 440 is formed in order that a region which is smaller than the region which is exposed with the etched passivation layer 430 is exposed.

Figure 3F:
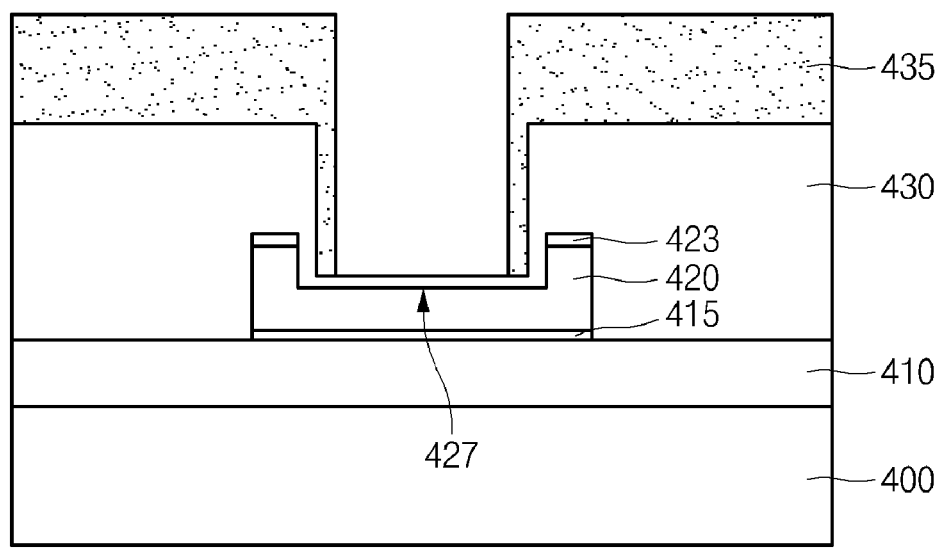

Referring to FIG. 3f, the PIQ layer 435 is etched using the third photoresist pattern 440 as a mask.

At this time, it is preferable that the PIQ layer 435 remains on the sidewalls of the etched passivation layer 430.

Figure 3G:
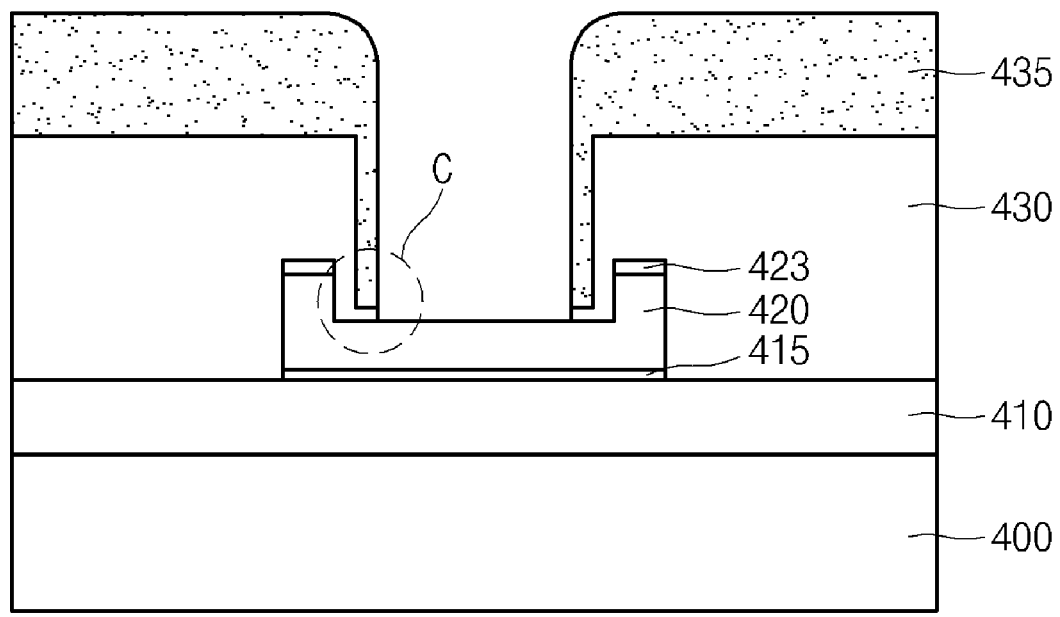

Referring to FIG. 3g, a curing process is performed for the PIQ layer 435.

The passivation layer 430 remaining in the exposed area is etched and the metal pad 420 is exposed.

At this time, the contact area between the PIQ layer 435 and the passivation layer 430 is increased on the metal pad 420 due to the step difference (see 'C' in FIG. 3g). The adhesive force between the passivation layer 430 formed according to the step difference of the trench and the PIQ layer 435 is improved. Thus, a lifting phenomenon of the PIQ layer 435 is not generated, and the metal pad 420 is not excessively opened in the curing process, so that the generation of attack is prevented in the etching process.

FIGS. 4a to 4i are cross-sectional views showing the pad open processing of a semiconductor device according to a second embodiment of the present invention.

Figure 4A:
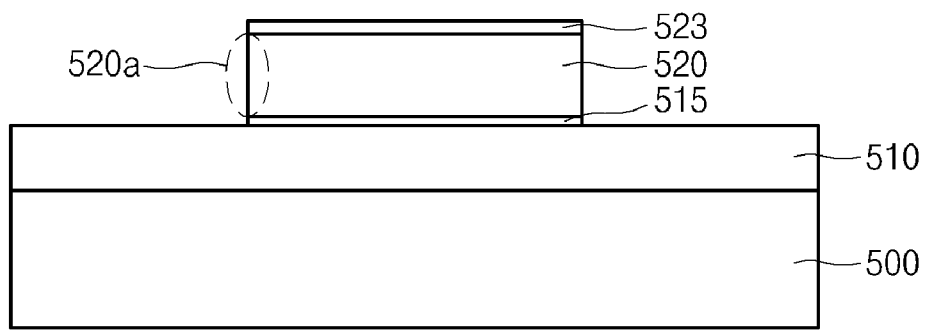
FIGS. 4a to 4i are cross-sectional views showing the manufacturing method of a semiconductor device according to a second embodiment of the invention.

Referring to FIG. 4a, an intervening dielectric layer 510 and a metal pad 520 are formed over a semiconductor substrate 500.

Here, it is preferable that the intervening dielectric layer 510 comprises an oxide layer, while a titanium nitride film 523 and a titanium film 515 are formed on and under the metal pad 520, respectively.

Figure 4B:
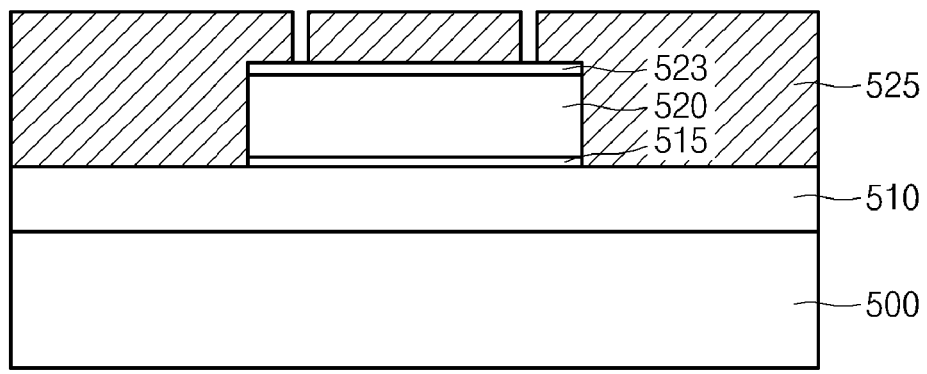

Referring to FIG. 4b, a first photoresist pattern 525 is formed over the metal pad 520.

At this time, preferably, in the first photoresist pattern 525, an open region in the shape of a cylinder or a parallelepiped is implemented in a location which is spaced respectively from the edge part of both side of the metal pad 520 into an inner side.

Figure 4C:
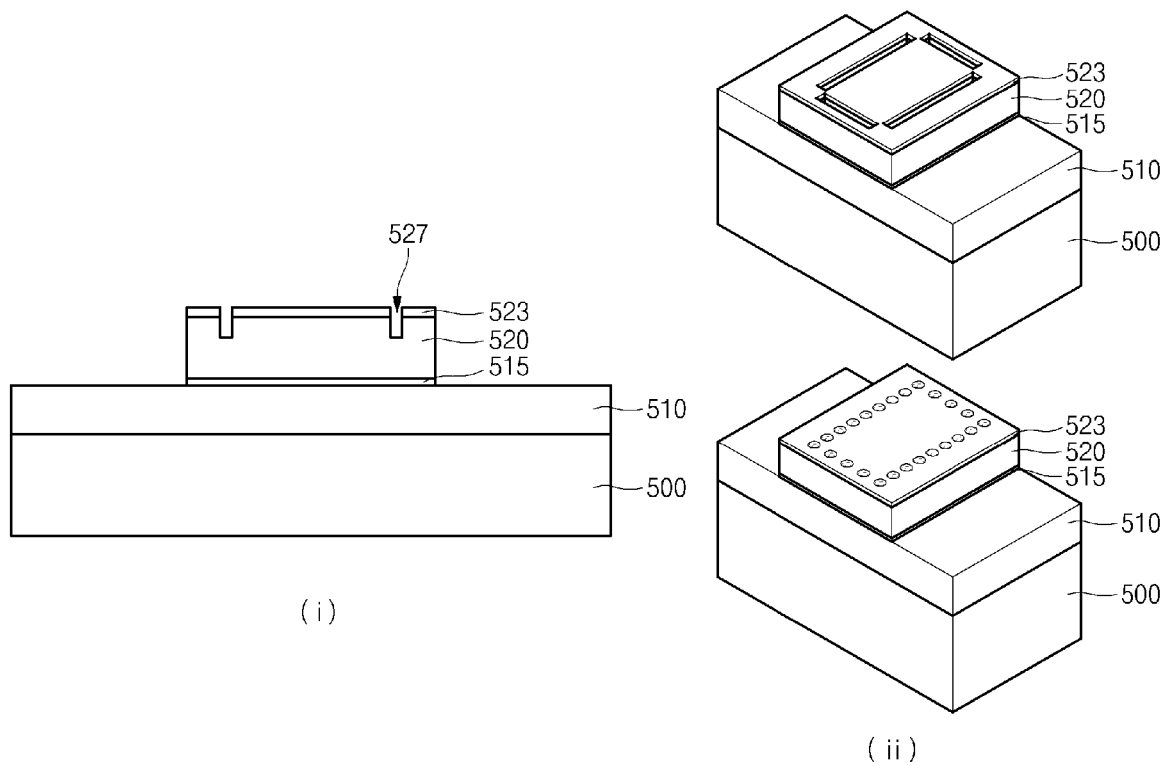

Referring to FIG. 4c(i), a trench is formed by etching the metal pad 520 with the first photoresist pattern 525 as a mask.

Here, it is preferable that the trench is formed in the shape of a cylinder or a parallelepiped in a location which is spaced apart respectively from the edge part of both sides of the metal pad 520 into the inner portion of the metal pad 520.

Referring to FIG. 4c(ii), which is a perspective view showing the metal pad 520 in which the trench is formed, it is shown that the trench of a cylinder or parallelepiped shape is implemented in a location which is spaced from the edge portion of both sides of the metal pad 520 into the inner portion thereof.

Here, preferably, a plurality of trenches of the cylinder type are implemented along an edge portion of the metal pad 520.

In addition, it is preferable that the trench of a parallelepiped shape be implemented in a direction parallel to the edge part of the metal pad 520.

Then, the first photoresist pattern 525 is removed.

Figure 4D:
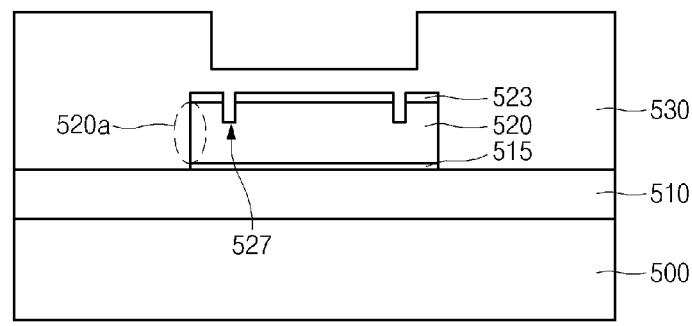

Referring to FIG. 4d, a passivation layer 530 is formed over an entire surface including the trench.

A second photoresist pattern (not shown) is formed over the passivation layer 530.

At this time, it is preferable that the central part of the metal pad 520, which includes the two trenches, is formed to be exposed in the second photoresist pattern (not shown).

The passivation layer 530 is etched with the second photoresist pattern (not shown) as a mask.

At this time, preferably, the passivation layer 530 remains over the metal pad 520.

Then, the second photoresist pattern (not shown) is removed.

Figure 4E:
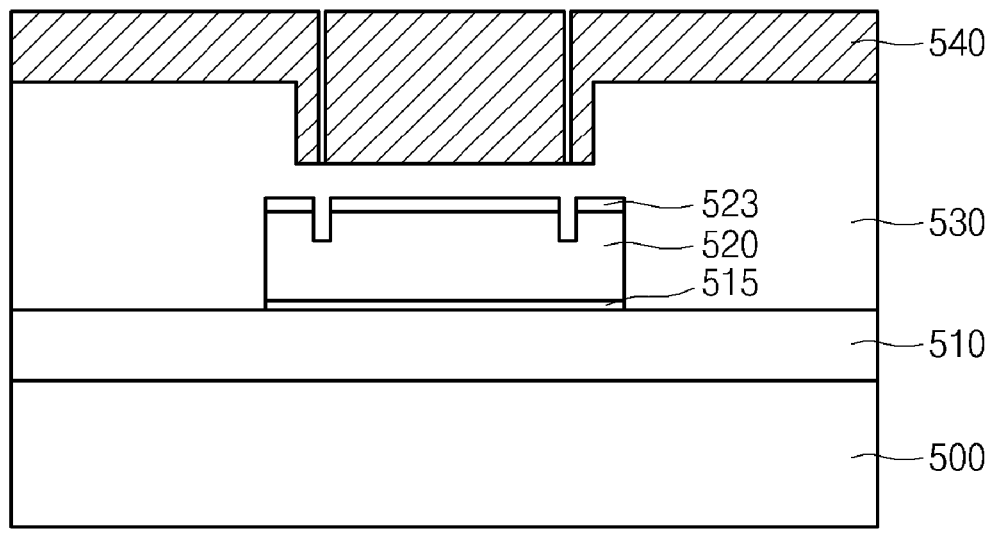

Referring to FIG. 4e, a third photoresist pattern 540 is formed over the etched passivation layer 530.

Here, it is preferable that the third photoresist pattern 540 is formed in order that a plurality of trenches are opened, while the line width is smaller than the line width of the trench.

Figure 4F:
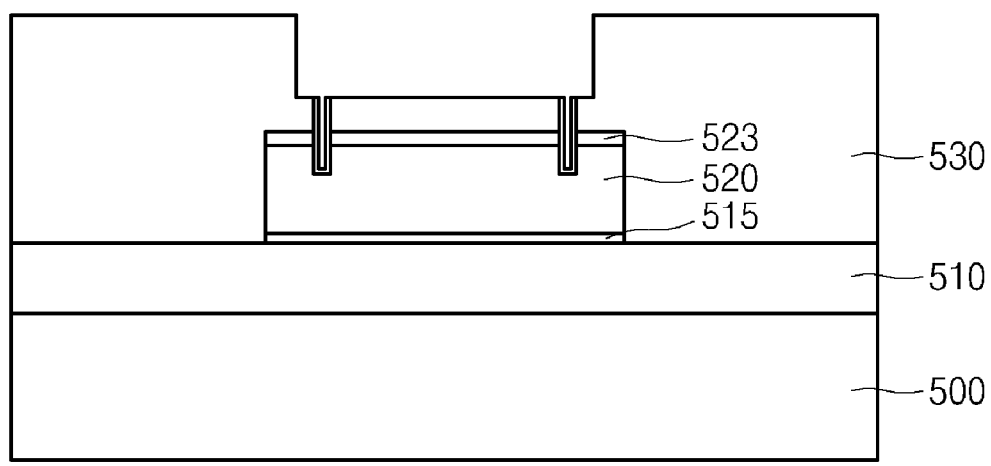

Referring to FIG. 4f, the passivation layer 530 is etched using the third photoresist pattern 540 as a mask.

At this time, preferably, the passivation layer 530 remains along the surface of the trench in order that the edge portion of the metal pad is not exposed.

Figure 4G:
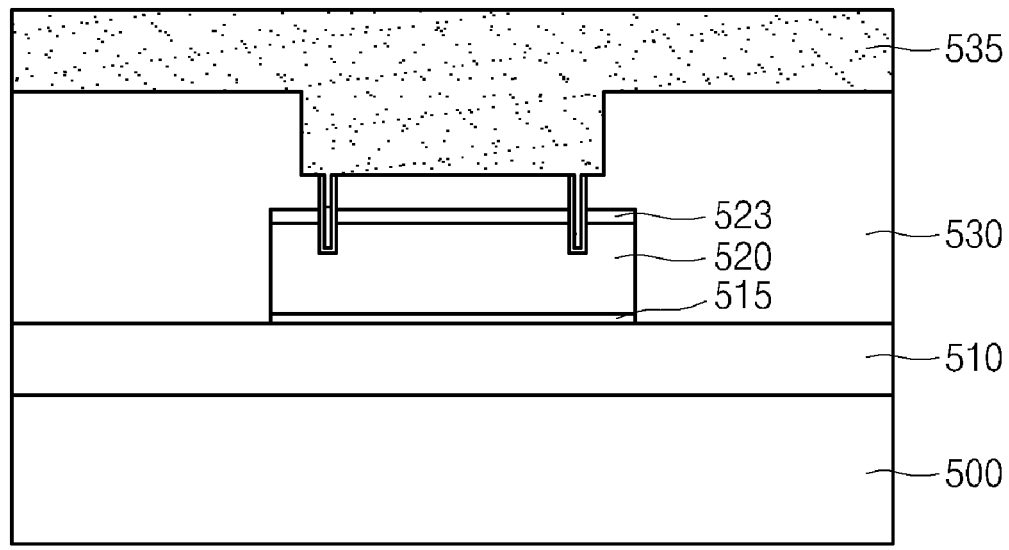

Referring to FIG. 4g, a PIQ or similar curable layer 535 is formed over an entire surface including the trench.

Figure 4H:
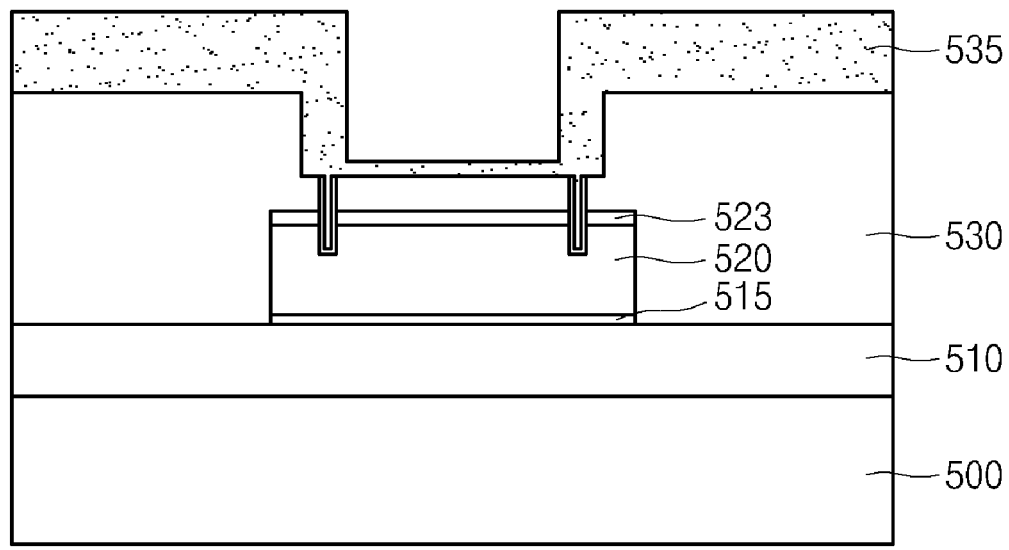
Figure 4I:
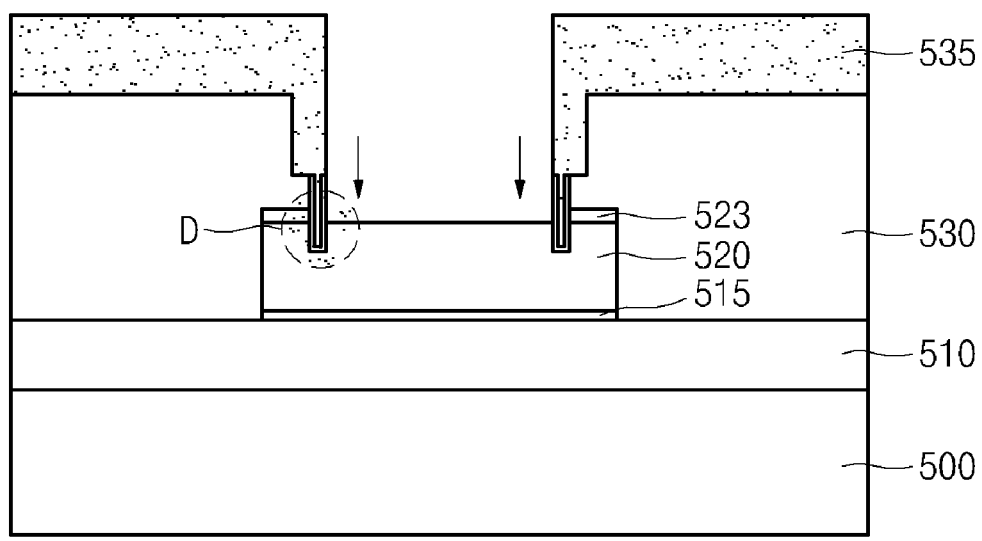

Referring to FIGS. 4h and 4i, a fourth photoresist pattern (not shown) is formed over the PIQ layer 535.

Here, it is preferable that the central part of the metal pad 520 is formed to be opened in the fourth photoresist pattern (not shown), whereas the plurality of trenches are not opened.

The PIQ layer 535 is then etched using the fourth photoresist pattern (not shown) as a mask.

At this time, the PIQ layer 535 remains on the sidewalls and the bottom of the etched passivation layer 530.

The PIQ layer 535 of the opened region, the passivation layer 530, and the titanium nitride film 523 are then etched to expose the metal pad 520.

At this time, preferably, the passivation layer 530 of the sidewalls of the trench is not etched.

Here, the trench of a cylinder or parallelepiped shape is generated (see 'D' in FIG. 4i). Therefore, a phenomenon occurs wherein the contact area between the passivation layer 530 formed along the step difference of the metal pad 520 and the PIQ layer 535 is increased, and the adhesive force thereby increases so that the PIQ layer 535 is excessively opened is prevented.

Here, since the metal pad 520 is not excessively opened, an attack generated in the passivation layer 530 in the etching process can be prevented.

The invention has the effect that the metal pad is etched to form a trench which has a step difference so that the contact area between the passivation layer and the curable polyimide isoindro quirazorindione (PIQ) or similar material layer is increased and the bondability is improved, and the problem that the metal pad is excessively opened in the subsequent curing process and the layer of the lower portion of the metal pad is attacked in the subsequent etching process is prevented.

The foregoing embodiments of the invention are illustrative and not limiting. Various alternatives and equivalents are possible. The invention is not limited by the type of deposition, etching polishing, and patterning steps described herein, nor is the invention limited to any specific type of semiconductor device. For example, the present invention may be implemented in a dynamic random access memory (DRAM) device or non volatile memory device. Other additions, subtractions, or modifications of the disclosure are intended to fall within the scope of the appended claims.

What is claimed is:

1. A method for manufacturing a semiconductor device comprising:
    forming a metal pad over a semiconductor substrate;
    etching the metal pad to form a trench defining at least one side surface;
    forming a first protection layer on an entire surface including the metal pad;
    etching the first protection layer whereby the first protection layer remains on the trench;
    forming a curable second protection layer on an entire surface including the etched first protection layer and the trench;
    etching the second protection layer whereby the first protection layer on the metal pad is exposed and the second protection layer remains on a side surface of the trench;
    curing the second protection layer; and
    etching the exposed first protection layer to expose the metal pad.

2. The method according to claim 1, further comprising forming an intervening dielectric layer between the semiconductor substrate and the metal pad.

3. The method according to claim 2, wherein the intervening dielectric layer comprises an oxide film.

4. The method according to claim 1, wherein the second protection layer comprises a polymide isoindro quirazorindione (PIQ) layer.

5. The method according to claim 1, further comprising forming a titanium nitride film on the metal pad.

6. The method according to claim 1, further comprising forming a titanium film under the metal pad.

7. The method according to claim 2, further comprising forming a titanium film between the metal pad and the intervening dielectric layer.

* * * * *